(12) United States Patent
Farrow et al.

(10) Patent No.: US 6,440,816 B1
(45) Date of Patent: Aug. 27, 2002

(54) ALIGNMENT MARK FABRICATION PROCESS TO LIMIT ACCUMULATION OF ERRORS IN LEVEL TO LEVEL OVERLAY

(75) Inventors: Reginald Conway Farrow, Somerset; Isik C. Kizilyalli, Millburn, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/771,621

(22) Filed: Jan. 30, 2001

(51) Int. Cl.[7] ............................................. H01L 21/76
(52) U.S. Cl. ...................... 438/401; 438/975; 438/427; 257/797
(58) Field of Search .................. 438/40, 975, 427; 257/797

(56) References Cited

U.S. PATENT DOCUMENTS

| | | | |
|---|---|---|---|
| 5,786,260 A | * | 7/1998 | Jang et al. |
| 5,893,744 A | * | 4/1999 | Wang ........................ 438/401 |
| 5,950,093 A | * | 9/1999 | Wei |
| 6,030,897 A | * | 2/2000 | Deconinck .................. 438/691 |
| 6,043,133 A | * | 3/2000 | Jang et al. .................. 438/401 |
| 6,049,137 A | * | 4/2000 | Jang et al. .................... 257/79 |
| 6,100,158 A | * | 8/2000 | Lee et al. ................... 438/401 |
| 6,303,460 B1 | * | 10/2001 | Iwamatsu .................. 438/401 |

* cited by examiner

Primary Examiner—John F. Niebling
Assistant Examiner—Jennifer M. Kennedy
(74) Attorney, Agent, or Firm—Harness, Dickey & Pierce, P.L.C.

(57) ABSTRACT

A process for device fabrication, including coating a wafer with a layer including $SiO_2$, $SiN_x$, and a first resist, defining shallow trench isolation and alignment patterns in the first resist, transferring the first resist pattern into the $SiO_2$ and $SiN_x$, removing the first resist, etching trenches to a depth suitable for shallow trench isolation, coating the wafer with a second photoresist, defining open areas around alignment-marks, etching alignment mark trenches to a depth greater than the trench depth, suitable for alignment mark detection, removing the second resist and the $SiN_x$, depositing $SiO_2$ to fill the trenches for shallow trench isolation and partially fill the alignment mark trenches for alignment mark detection; and performing chemical mechanical polishing, leaving shallow trench isolation features and topographical alignment marks. As a result, alignment marks can be fabricated from the STI level with an arbitrary depth and an $SiO_2$ fill to produce topography and/or material contrast without accumulating errors by using a mask that is separate from the transistor isolation feature mask to define the alignment mark positions.

28 Claims, 7 Drawing Sheets

ALIGNMENT MARK FABRICATION PROCESS TO LIMIT ACCUMULATION OF ERRORS IN LEVEL TO LEVEL OVERLAY

TECHNICAL FIELD

This invention relates to the field of lithography and in particular, to a method of fabrication.

BACKGROUND ART

FIG. 1 schematically depicts a Scattering with Angular Limitation in Projection Electron Lithography (SCALPEL) process. In general, the SCALPEL approach employs the principle of electron scattering to delineate circuit patterns on substrates. A mask 2 is used to shape an electron beam source. Mask 2 includes electron transmissive regions 22 and 24 having different electron scattering properties. Region 22 is a pattern of high electron scattering material, examples of which include high atomic number metals such as gold and tungsten. Region 24 is a low electron scattering material, for example, a low atomic number element or compound, such as silicon or silicon nitride formed into a membrane.

As electron beam 1 traverses the mask 2, electrons are scattered, the amount and angle of scattering being a function of the atomic number of the constituent atoms in the material. As a result of the differential scattering properties of the mask 2, an angular distribution of electrons is formed at the exit surface of the mask 2. Those electrons 3 having passed through patterned region 22 of high atomic number material are generally scattered to a higher angle than those electrons 4 which passed only through the low atomic number membrane region 24.

The scattered electrons 3 and 4 pass into projection lens system 30, which demagnifies the image formed by the scattered electrons. In the back focal plane of the projecting lens system, the electrons are distributed by their angle of scatter. A filter 40 having an aperture 42 is placed in the back focal plane to angularly select electrons, which will form the ultimate image. If aperture 42 is sufficiently small and on the focal axis, only those electrons scattered through small angels will contribute to the final image 52 on substrate 50. The electrons scattered through small angles 3, i.e., electrons which passed through the low atomic number membrane regions 24, are the electrons which interact with a substrate material, such as a resist, to create a latent image. For a given mask and optical system, the contrast in the image is determined by the size of the angularly limiting aperture. SCALPEL lithography is further described in Berger et al., J. Vac. Sci. Technol., B9, November/December 1991, pp. 2996–1999 and U.S. Pat. Nos. 5,079,112 and 5,130,213, the entire contents of which are incorporated by reference herein.

As described above, device fabrication technology is based on the use of lithography (SCALPEL being one example) to create the features and patterns that make up an integrated circuit. Because many patterns may be combined to form an integrated circuit, the substrate on which the device is formed should be precisely aligned with the lithographic apparatus to ensure that the pattern being introduced aligns properly with the other patterns already formed on the substrate as well as those patterns that are formed subsequently on the substrate. Alignment marks are typically formed on the substrate to assist in the orientation of the substrate, the mask pattern that is used to pattern the radiation introduced onto the substrate, and the optics of the lithographic apparatus.

The detectability of the alignment marks depends upon the mark layout, the material used to fabricate the mark, the topography of the mark, and the operating conditions during mark detection.

Alignment mark detection is affected by many factors including mark geometry, signal-to-noise ratio and detector efficiency.

In U.S. Pat. No. 5,824,441, the entire contents of which is incorporated by reference herein, a mask and a substrate are aligned using topographic alignment marks in which the material and configuration thereof have been selected to obtain a desirable backscattered electron (BSE) signal contrast between an aligned and a non-aligned state (hereinafter referred to as BSE contrast). The technique may be used in a lithographic process for device fabrication in which an electron beam generator is the source of the exposing energy. Examples of such processes include projection electron beam lithography, shaped beam lithography, and direct write electron beam lithography.

In U. S. Pat. No. 5,824,441, the BSE contrast is a function of the alignment mark geometry, the energy of the incident electron beam, the position of the electron detector relative to the alignment marks on the wafer, and the material in which the alignment marks are formed.

The dimensions of the alignment mark should also be selected to be compatible with the dimensions of the devices to be fabricated by the process in which the alignment marks are used. That is, if the critical dimension of the devices being fabricated is 0.1 $\mu$m, then it is advantageous if the width of the alignment marks features are 0.1 $\mu$m or larger. The detectable signal amplitude (or S/N) as it relates to the area of the mark determines the practical lower limit. The available area between chips (Kerf) on the wafer determines the practical upper limit. The scanning ability of the tool is a practical upper limit on the width of the alignment mark.

As set forth above, alignment marks are introduced into the substrate, typically a silicon wafer or a layer of material overlying a silicon wafer which is commonly used in semiconductor device fabrication, using lithographic techniques well known to one skilled in the art.

As noted in Farrow, R., et al., "Mark topography for alignment and registration in projection electron lithography," SPIE, vol. 2723, pp. 143–149 (March 1996), which is hereby incorporated by reference, a wet etching expedient such as potassium hydroxide is useful to form V-groove alignment marks in a silicon wafer. V-grooves may be formed using e-beam lithography. Trench-shaped alignment marks may be formed using a plasma etch. An alignment mark configuration is selected that is formed by an expedient that is compatible with the overall process for device fabrication.

An issue for process integration of a SCALPEL system is alignment mark detection on integrated circuit process levels that provide minimal backscattered electron (BSE) signal contrast. This is analogous to weak alignment signals in optical lithography but may occur at different levels than for e-beam lithography. Depending on the oxide process, detecting alignment mark signals from thin oxide levels (TOX) (active area) can be challenging for both optical and e-beam lithography. A LOCOS (local oxidation of silicon) process leaves $SiO_2$ features that have topography (illustrated in FIG. 2a), and provides a suitable alignment mark for traditional optical lithography. Gate alignment to TOX is made more difficult for an optical stepper when shallow trench isolation (STI) is used since a chemical mechanical polish (CMP) usually follows STI. As illustrated in FIG. 2b, CMP leaves little or no topography on the substrate surface. $SiO_2$ on Si as an alignment mark material is not preferred for e-beam lithography at 100 keV because the BSE contrast (between the $SiO_2$ alignment marks and the surrounding Si) is minimal with the layer thickness' (i.e., 10–20 nm) that are typically used in CMOS processing. For features with a low aspect ratio (a ratio of height to depth) less than 0.5), the BSE contrast at 100 keV is generally not from topography and is process independent.

An exemplary alignment mark fabrication process is shown in FIGS. 3a–3f. The Si wafer 10 has <100> orientation and a thickness of 200 mm. 150 Å of $SiO_2$ (layer 12) and 3200 Å of $SiN_x$ (layer 14) are deposited on the Si wafer 10 as shown in FIG. 3a. Resist is applied and photolithography is performed using a mask to form a SCALPEL alignment mark as shown in FIG. 3b. The feature sizes in the mark patterns range from 0.5 to 2.5 µm. After pattern transfer into the $SiO_2/SiN_x$ layer 12/14, the wafer 10 is etched to form trenches 16 in the Si as shown in FIG. 3c. The trench depths range form 0.5 to 2.5 µm. The $SiN_x$ layer 14 is then removed as shown in FIG. 3d and $SiO_2$ 18 is deposited using a high density plasma (HDP) process as shown in FIG. 3e. The final step is to CMP the wafer 10 as shown in FIG. 3f.

The alignment mark illustrated in FIG. 3f is unsuitable for at least two reasons. First, as discussed above, the material properties of the Si and $SiO_2$ produce minimal scattered electron signal contrast, which makes the alignment mark difficult to detect with an electron beam lithography tool. Second, the alignment mark has little (if any) topography, as a result of the CMP step, which makes the alignment mark difficult to detect with an optical stepper.

The purpose of device isolation is to isolate one electrically active region from the other. Shallow trench isolation (STI) is one of the most advanced isolation structures for ultra-large scale used today. A brief history of STI is set forth below.

The concept of using trenches of insulator material for device isolation has been discussed since the early days of semiconductor integrated circuits (IC). Many attempts were made to demonstrate STI for CMOS device technologies in the 1980's. The keys to success were the proper refill of the trenches with insulator material (some form of silicon oxide) and the removal of such oxide from the intended active regions while keeping it inside the trenches. The most common refill methods utilize chemical vapor deposition (CVD) or plasma enhanced chemical vapor deposition (PECVD), and a common removal method in silicon processing is reactive ion etching (RIE), which etches material predominantly in the direction perpendicular to the substrate surface. Generally, refill deposition deposits the same amount of oxide on the top of a trench and at the bottom of a trench, at least in the case when the trench width is much larger than the oxide thickness. Therefore, performing etchback with RIE of oxide does not produce the desirable structure. Instead, methods that can create a planarized oxide surface, taking advantage of the step height between the active regions and the trenches are necessary. One of the earlier approaches utilized CVD silicon oxide followed by planarizing photoresist and etch back of such structure with the same etch rate for oxide and photoresist. Later improvements, such as silicon nitride for etch stop and oxidation/diffusion barrier, oblique angle ion implant for suppressing sidewall parasitic conduction and polycrystalline silicon field shield, were introduced. However, difficulty in etchback control continued to plague any effort to introduce shallow trench isolation to mass production of silicon IC. It was not until a better method of planarization became viable that STI finally received wide acceptance.

As a result of the advance of chemical mechanical polishing (CMP), the issue of planarization for STI was resolved and STI process with CMP planarization became a viable candidate for mass production. The key steps of a representative process flow are described as follows.

The process flow starts with the growth of a buffer of silicon dioxide ($SiO_2$) 12 and deposition of silicon nitride ($Si_3N_4e$) 14 on $S_i$ wafer 10 as shown in FIG. 4a. The choice of nitride 14 thickness depends on many factors, such as the choice of final trench depth, CMP selectivity and isolation topography (step height). For a typical 0.18 µm CMOS technology, the nitride 14 thickness is about 150 nm. The nitride serves several purposes. First, it is used as the stopping layer for the CMP planarization process. Second, the nitride 14 is a good oxygen diffusion barrier so it protects the area underneath (the intended active regions) from oxidation during any subsequent oxidation step. Finally, the nitride 14 can be patterned first and used as a mask for trench etching. The trench etching is performed by RIE. In this case, photoresist patterns generated by lithography are used as a mask to pattern the nitride 14. Then, the photoresist is removed, and the nitride patterns become the mask for etching of silicon trenches. Although both nitride and silicon can be etched with a photoresist mask, the approach of using nitride 14 as a mask generally produces more consistent trench sidewall profiles with less pattern sensitivity. An illustration of a silicon trench 16 after trench etch is shown in FIG. 4b. Although in the illustration the trench sidewalls are shown to be perpendicular (90°) to the bottom surface of the trench, the sidewall angle can be readily tuned by the RIE conditions, typically from 70° to nearly 90°.

After RIE forms silicon trenches, an oxidation step is employed to form silicon oxide 20 inside the trenches as illustrated in FIG. 5a. This oxidation 20, commonly referred as linear oxidation, serves three purposes. First, the high temperature of the oxidation step (typically 850° to 1150° C.) will passivate the physical damage to the crystalline silicon from RIE. Second, it provides a buffer layer for the deposition of refill oxide. As deposited, the refill oxide is typically of inferior quality to thermally grown oxide, and the method of deposition, such as PECVD, may also damage the silicon substrate Therefore, a thermally grown buffer layer is always considered necessary. Finally, it helps modify the profile of the top trench corners from an abrupt angle to a more gradual and rounded transition. After the linear oxidation, refill oxide 22 is deposited to fill the trench 16. There are many choices of such oxide: PECVD, CVD and spin-on oxide. The factors to be considered are the quality of the oxide and the filling capability —to fill trenches without voids or seams. At first, CVD silane-based oxide or TEOS (tetraethylorthosilicate) were used, but their filling capability is not suitable for a trench with an aspect ratio (Ar, defined as the ratio of overall trench depth to trench width) greater than two. Ozone-enhanced CVD TEOS ($O_3$-TEOS) has a superior filling capability compared to CVD TEOS, but it has relatively low density as deposited, which requires up to 1200° C. densification anneal. The stress induced from volume change and high temperature anneal can lead to defects in silicon substrate 10 and high junction leakage.

Another widely used method of deposition utilizes high-density plasma (HDP) with independent dc bias control. High dc bias during deposition reduces oxide deposition on the trench sidewall to nearly zero (commonly referred as zero step coverage), and the filling of the trench 16 is basically from bottom up. Because of the zero step coverage, this type of deposition inherently produces no void or seams, and it has good filling capability. Moreover, the intensive ion bombardment of HDP helps densify oxide during deposition, and it makes the properties of as-deposited HDP oxide similar to those of thermally grown oxide. FIG. 5b shows the structure after the trench filling of HDP deposition. Note that the 45° sloped sidewall coverage of the oxide 22 over a step is a characteristic of HDP deposition. After the deposition, it may be necessary to anneal the refill oxide 22 to improve the density and quality of the material, depending on the choice of refill oxide 22. It is also possible to defer the densification to a later stage.

The refill oxide 22 is polished back by an oxide CMP that is selective with respect to silicon nitride. Namely, the polishing rate of silicon nitride is slower than that of silicon oxide. Polishing selectively depends on the type of oxide, polish pad material and slurry. After CMP, the structure is planarized as illustrated in FIG. 6a. At this stage, additional anneal with oxygen may be used to modify the top corners of the trench. Silicon nitride is then stripped, typically in a mixture of phosphoric acid, hydrogen peroxide and water heated to 80° C. This step is often preceded by a deglaze step, a diluted HF etch to remove any surface oxide. After the nitride removal, the buffer oxide underneath is typically removed by diluted HF, and a thin layer of oxide (5 to 20 nm in thickness) is grown on silicon surface. This oxide serves as screen oxide for the channel-stop implant and other implants, such as transistor threshold-voltage ($V_t$) adjustment and high-energy well implants. The purpose of channel-stop implant is to raise the threshold voltage of parasitic field oxide transistors. Therefore, an n-type implant is used for p-type transistors and vice versa. The screen oxide needs to be removed before the gate oxidation. This is also known as sacrificial oxide because it serves the purpose of reducing defect density of gate oxidation by consuming surface silicon that might be damaged during preceding processing. The removal of screen oxide is commonly recognized as the last step of the STI process as illustrated in FIG. 6b. For silicon MOSFET processing, the process continues with gate oxidation, gate stack formation, junction formation and metalization.

In a standard CMOS process, it is necessary to align the gate level to the transistor isolation level with alignment marks that are detectable with the lithography stepper. Isolation is achieved with a field oxide feature. The alignment marks fabricated with this oxide process are detectable in optical steppers from the topography that remains after processing this oxide level. When an STI process is used, the alignment marks have reduced contrast because the CMP step in the STI process leaves topography that is minimally suitable for alignment mark detection in an optical stepper. The alignment marks are also difficult to detect with an electron beam lithography tool because of the lack of topography and minimal scattered electron signal contrast from the material properties of the alignment marks.

One solution is to change the alignment mark geometry by etching the alignment mark pattern deep (>1 µm) into the Si wafer. A problem with this solution is that the STI feature line widths are so small (=<0.2 µm) that the high aspect ratio of the required deep etch can not be achieved without increasing the line width of the trench. This problem will get worse over time because of smaller design rules.

Another possible solution is to utilize separate process levels for the STI and the alignment mark. If the gate level is aligned to an alignment mark that was not patterned with the same mask as the STI level, the alignment errors will accumulate and the alignment requirements will have to be tightened (compared to a single level alignment) to achieve the necessary overlay.

SUMMARY OF THE INVENTION

The present invention is directed to a method to etch and fill the alignment mark features without compromising the transistor isolation features and without accumulating alignment errors by patterning the marks with a different mask than the transistor isolation features. This is done by proceeding with the STI process in the normal sequence up to the Si etch for the trenches. The Si trench etch is stopped at a suitable depth for transistor isolation. Up to this point the transistor isolation and the alignment mark features are defined in the $SiN_x/SiO_2$ hardmask. Resist is then deposited on this structure. A mask is then formed on the substrate that has open areas that will be aligned to alignment mark areas on the wafer in a stepper. This alignment will not be critical alignment because the only significant purpose is to open an area that will expose the underlying $SiN_x/SiO_2$ hardmask. The resist-coated wafer can then be exposed in a stepper with the alignment mark window mask and the resist can then be developed. The Si can then be etched with the $SiN_x/SiO_2$ as the hardmask only in the alignment mark areas. The other features are protected by the resist. The alignment features can then be etched to a suitable depth for alignment mark signal contrast without compromising the transistor isolation feature process. The resist and the $SiN_x$ hardmask may then be removed and the appropriate $SiO_2$ deposition process performed to improve the mark signal for optical or e-beam detection.

In one exemplary embodiment of the present invention, the alignment marks for optical and e-beam lithography will have increased contrast if the marks are etched deeper than the transistor isolation features. The $SiO_2$ fill of the trenches may be done only to a thickness to fill the transistor isolation features. This leaves the alignment marks features partially filled and leaves topography after the CMP process. Both optical and e-beam lithography would benefit from this arrangement.

In another exemplary embodiment of the present invention, for the e-beam case, alignment signal contrast may also be derived from the material differences between the Si and the $SiO_2$ features. To derive sufficient contrast, the $SiO_2$ thickness should be greater than 1 µm when 100 keV electrons are used to detect the marks. This condition can be met by etching the alignment mark trenches deep enough to achieve the required $SiO_2$ thickness. Then the $SiO_2$ deposition fills the alignment mark trenches. E-beam lithography would benefit from this arrangement.

FIG. 1 schematically depicts a conventional SCALPEL process.

FIGS. 4a–4b, 5a–5b, and 6a–6b illustrate a conventional STI process.

Figure 1:
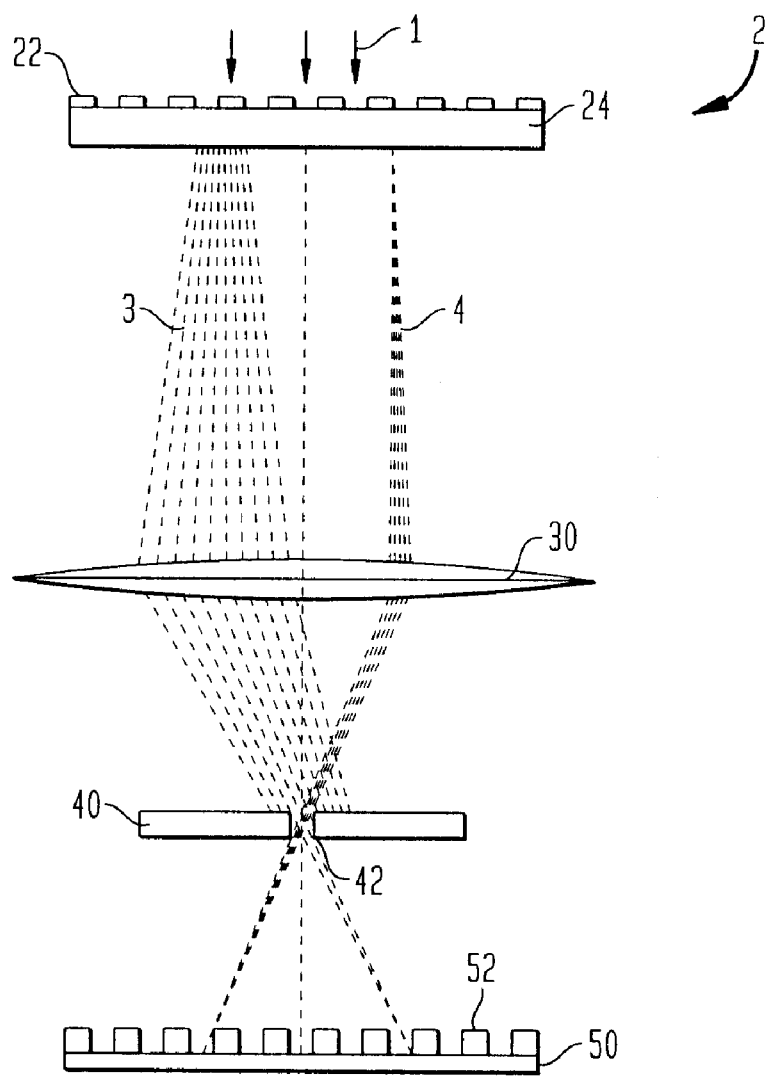
Figure 2A:
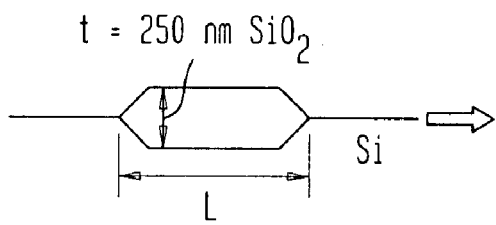
FIG. 2a illustrates the topography of a LOCOS process.
Figure 2B:
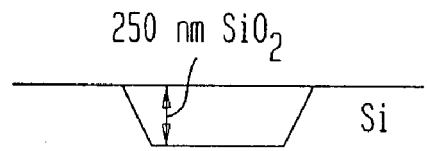
FIG. 2b illustrates the results of CMP.
Figure 3A:
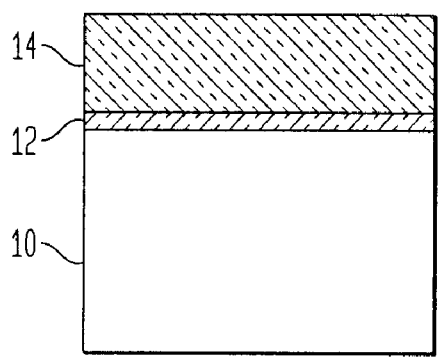
FIGS. 3a–3f illustrate a conventional mark fabrication process.
Figure 3B:
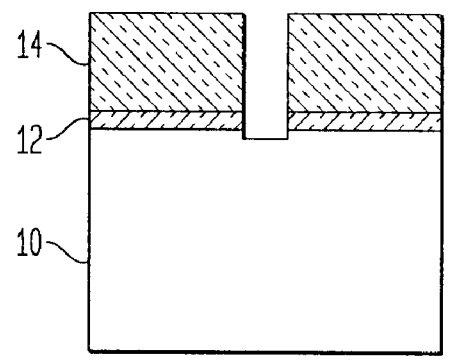
Figure 3C:
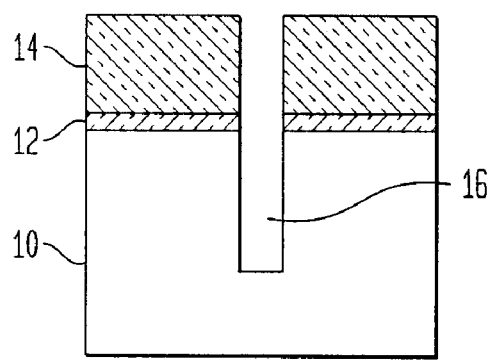
Figure 3D:
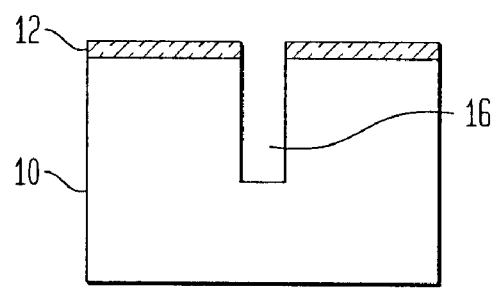
Figure 3E:
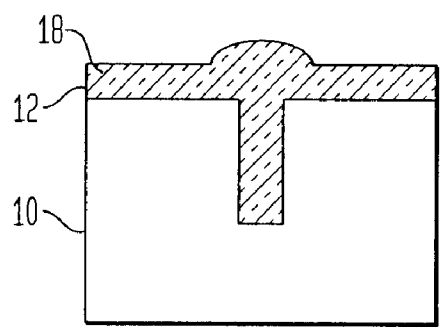
Figure 3F:
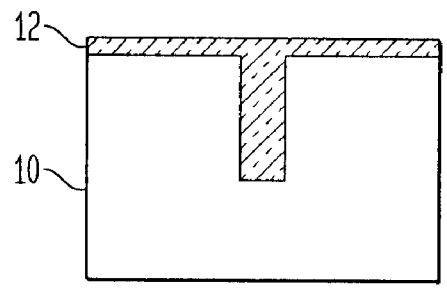
Figure 4A:
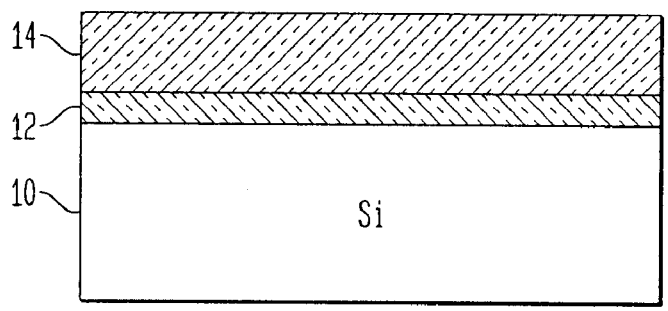
Figure 4B:
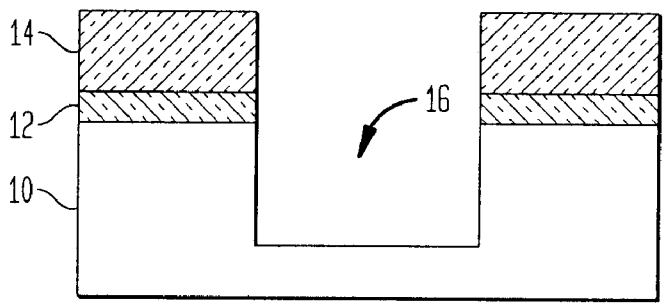
Figure 5A:
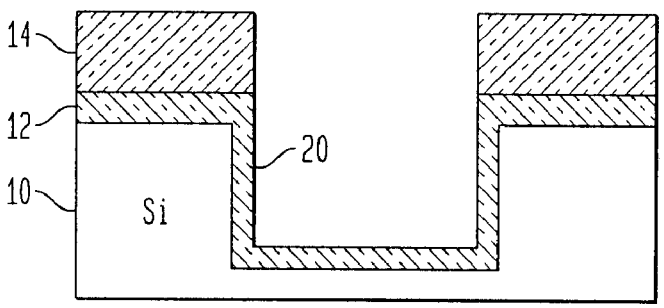
Figure 5B:
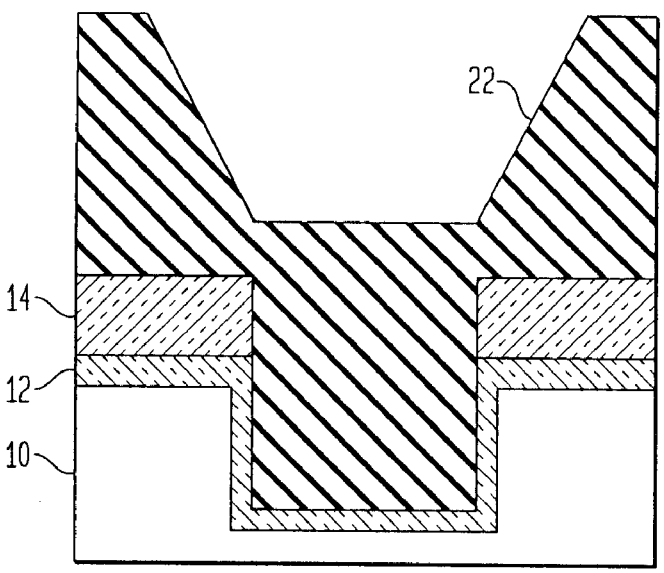
Figure 6A:
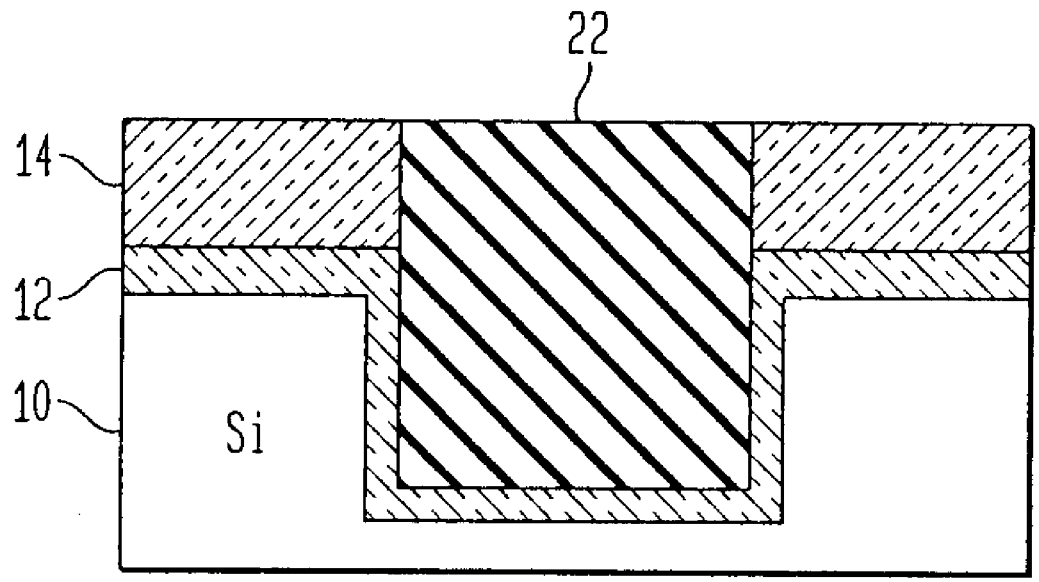
Figure 6B:
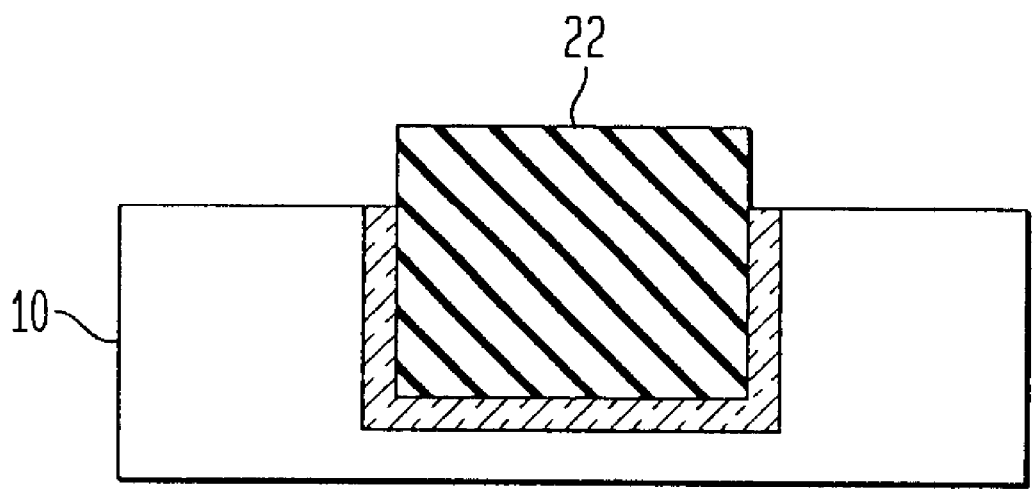
Figure 7A:
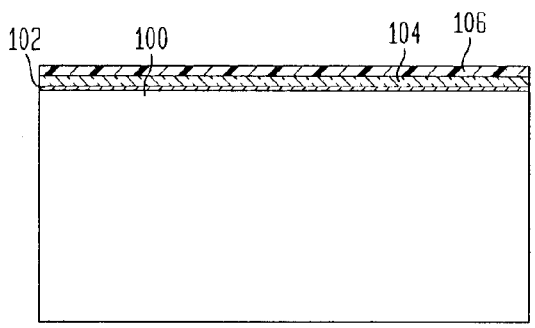
Figure 7B:
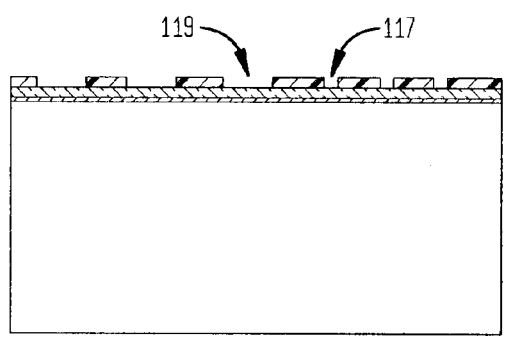
Figure 7C:
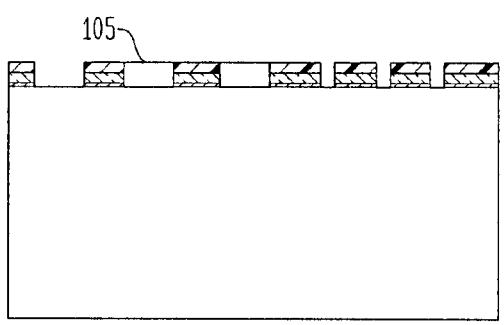
Figure 7D:
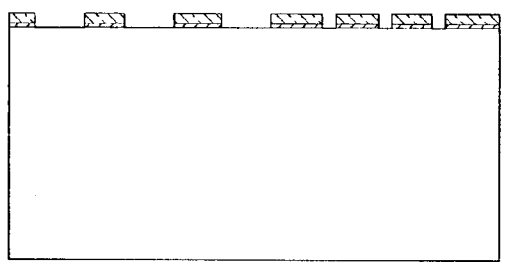
Figure 7E:
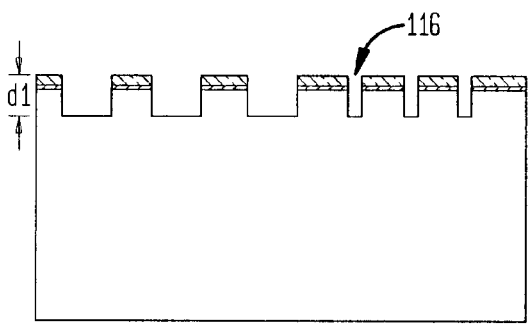
Figure 7F:
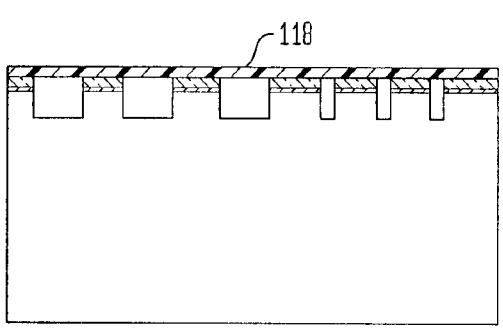
Figure 7G:
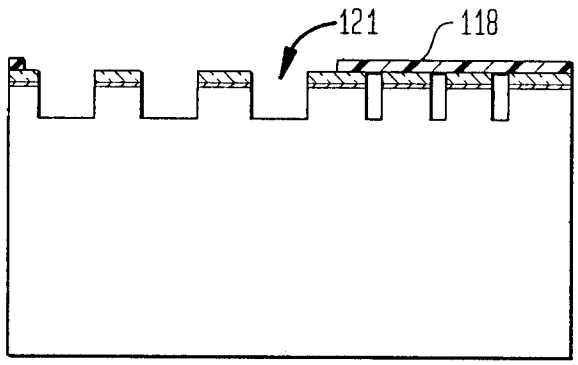
Figure 7H:
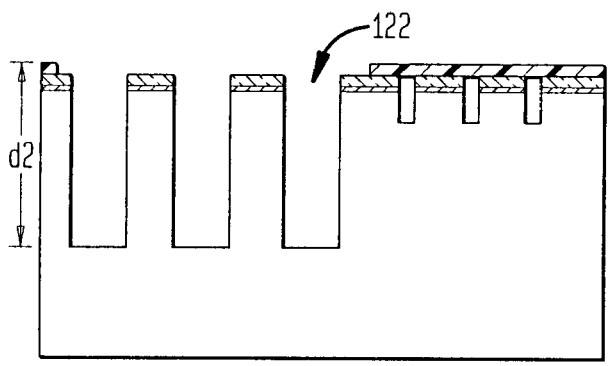
Figure 7I:
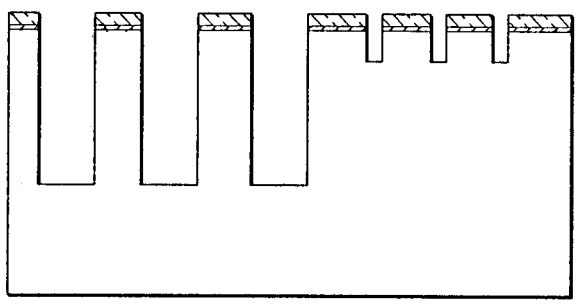
Figure 7J:
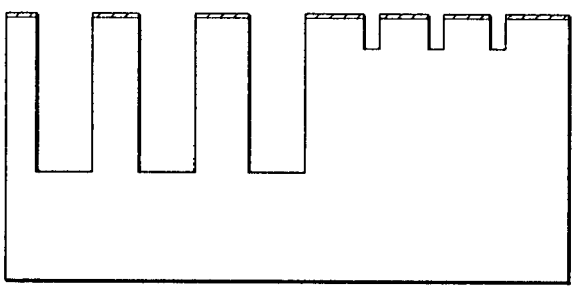
Figure 7K:
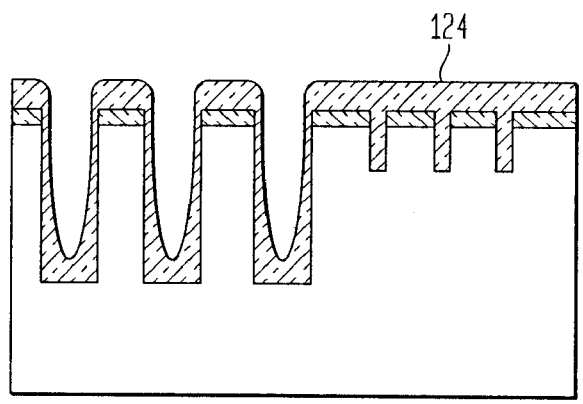
Figure 7L:
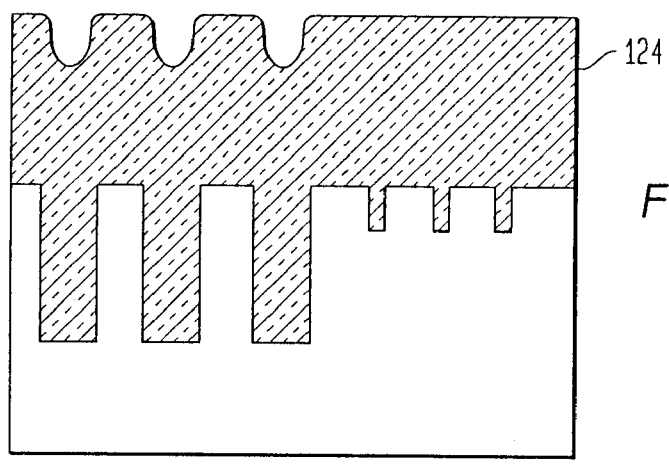
Figure 7M:
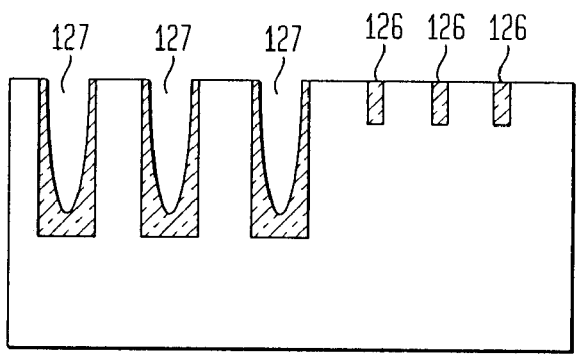
Figure 7N:
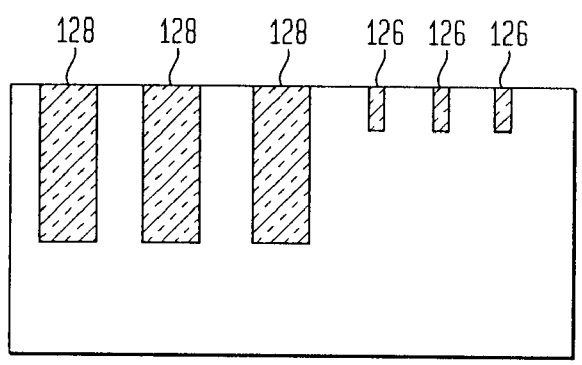

FIGS. 7a–7n illustrate the method of the present invention in one exemplary embodiment.

DETAILED DESCRIPTION OF THE PREFERRED EMBODIMENT

An exemplary embodiment of the present invention is described below in connection with FIGS. 7a–7n. As illustrated in FIG. 7a, a wafer 100 is coated with a layer 102 including $SiO_2$ 102, $SiN_x$ 104, and photoresist 106. Photolithography is used to define the STI pattern 117 and the alignment mark patterns 119 in the photoresist 106, as illustrated in FIG. 7b. The photoresist pattern 105 is then transferred to the $SiO_2/SiN_x$ layer 102/104, as illustrated in FIG. 7c, using standard processing techniques. The photoresist 106 is then removed, as illustrated in FIG. 7d.

Trenches 116 are etched to a depth d1 that is suitable for STI into the wafer 100 using a conventional plasma processing technique as illustrated in FIG. 7e. The wafer 100 is coated with photoresist 118, as illustrated in FIG. 7f. Photolithography is used to define open areas 121 around the alignment marks 119, as illustrated in FIG. 7g. Alignment mark trenches 122 are etched to a depth d2 suitable for mark detection (for either optical or e-beam detection), as illustrated in FIG. 7h. In FIG. 7i, the resist 118 is removed and in FIG. 7j, the $SiN_x$ layer 104 is removed. For optical or e-beam detection, $SiO_2$ 124 is deposited to fill the STI trenches 116 leaving the alignment mark trenches 122 partially filled, as illustrated in FIG. 7k. For the e-beam only case, $SiO_2$ 124 is deposited to fill the STI trenches 116 and the alignment mark trenches 122, as illustrated in FIG. 7l. For the optical and e-beam case, CMP is performed on the wafer 100 leaving STI features 126 and topographic alignment marks 127, as illustrated in FIG. 7m. For the e-beam only case, CMP is performed on the wafer 100 leaving STI features 126 and SiO2/Si alignment marks 128, filled, as illustrated in FIG. 7n.

In one exemplary embodiment, $Si_3O_4$ is used as layer 104. Further, although the above embodiments have been described using $SiO_2$, $SiN_x$ and photoresist, any suitable layer or layers may also be used. It is further noted the methods described above are applicable to projection electron beam lithography, shaped beam lithography, and direct write electron beam lithography.

For the 0.16 μm IC generation, the STI features are 0.2 μm and scalable to 0.130 μm for the 0.1 μm generation.

In summary, the present invention uses the STI mask to pattern the alignment mark into a hard mask. Then the wafer is etched to a suitable depth for the STI features. In the present invention, resist is applied after the STI etch and lithography is used to open the areas where the hard mask remains for the alignment mark features. The etch is then continued to a suitable depth for the alignment marks. The STI process can then be resumed as normal.

In the STI process, a mask is fabricated which contains the transistor isolation features and alignment marks. The alignment marks from the STI level can be used to align the masks for the transistor implants (so-called p tub and n tub implants) and of the gate length (L) divided by 3 (i.e. L/3). The STI features can be fabricated by depositing a $SiO_2$ layer and a layer of $SiN_x$ on a silicon wafer. Resist may be deposited and exposed using the STI mask in a lithography stepper. The resist is developed and the resulting pattern is transferred into the $SiO_2/SiN_x$ layer to form a mask for the Si etch. The Si is then etched to a suitable depth to isolate the transistors. The $SiN_x$ is removed and the trenches are filled with $SiO_2$. A CMP process follows to remove excess $SiO_2$ on the wafer surface and planarize the wafer for the remaining processes.

An advantage of the present invention as embodied above, is that alignment marks can be fabricated from the STI level with an arbitrary depth and an $SiO_2$ fill to produce topography and/or material contrast without accumulating errors by using a mask that is separate from the transistor isolation feature mask to define the alignment mark positions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for device fabrication, comprising:
   coating a wafer with a layer including $SiO_2$, $SiN_x$, and a first resist;
   defining shallow trench isolation and alignment patterns in the first resist;
   transferring the first resist pattern into the $SiO_2$ and $SiN_x$;
   removing the first resist;
   etching trenches to a depth suitable for shallow trench isolation;
   coating the wafer with a second photoresist;
   defining open areas around alignment marks;
   etching alignment mark trenches to a depth greater than the
   trench depth, suitable for alignment mark detection;
   removing the second resist and the $SiN_x$;
   depositing $SiO_2$ to fill the trenches for shallow trench isolation and partially fill the alignment mark trenches for alignment mark detection; and
   performing chemical mechanical polishing, leaving shallow trench isolation features and topographical alignment marks.

2. The process for device fabrication of claim 1, wherein $SiN_x$ is $Si_3N_4$.

3. The process for device fabrication of claim 1, wherein the process is applicable to projection beam lithography, shaped beam lithography, or direct write electron beam lithography.

4. The process of fabrication of claim 3, wherein the process is a SCALPEL process.

5. The process of fabrication of claim 3, wherein the process is used to make 0.16 μm IC devices.

6. The process of fabrication of claim 3, wherein the process is used to make 0.1 μm IC devices.

7. A process for device fabrication, comprising:
   coating a wafer with a layer including $SiO_2$, $SiN_x$, and a first resist;
   defining shallow trench isolation and alignment patterns in the first resist;
   transferring the first resist pattern into the $SiO_2$ and $SiN_x$;
   removing the first resist;
   etching trenches to a depth suitable for shallow trench isolation;
   coating the wafer with a second photoresist;
   defining open areas around alignment marks;
   etching alignment mark trenches to a depth greater than the trench depth, suitable for alignment mark detection;
   removing the second resist and the $SiN_x$;
   depositing SiO2 to fill the trenches for shallow trench isolation and fill the alignment mark trenches for alignment mark detection;
   performing chemical mechanical polishing, leaving shallow trench isolation features and SiO2/Si alignment marks.

8. The process for device fabrication of claim 7, wherein $SiN_x$ is $Si_3N_4$.

9. The process for device fabrication for claim 7, wherein the process is applicable to projection beam lithography, shaped beam lithography, or direct write electron beam lithography.

10. The process of fabrication of claim 9, wherein the process is applicable to SCALPEL.

11. The process of fabrication of claim 9, wherein the process is used to make 0.16 μm IC devices.

12. The process of fabrication of claim 9, wherein the process is used to make 0.10 μm IC devices.

13. A process for device fabrication, comprising:

coating a wafer with a multi-layer;

defining shallow trench isolation and alignment patterns in the multi-layer;

etching trenches in the multi-layer and the wafer to a depth suitable for shallow trench isolation;

coating the wafer with a second layer;

etching alignment mark trenches in the second layer and the wafer to a depth greater than the trench depth, suitable for alignment mark detection;

depositing material to fill the trenches for shallow trench isolation and partially fill the alignment mark trenches for alignment mark detection; and performing chemical mechanical polishing, leaving shallow trench isolation features and topographical alignment marks.

14. The process for device fabrication of claim 13, wherein the process is applicable to projection beam lithography, shaped beam lithography, or direct write electron beam lithography.

15. The process of fabrication of claim 14, wherein the process is applicable to SCALPEL.

16. The process of fabrication of claim 14, wherein the process is used to make 0.16 μm IC devices.

17. The process of fabrication of claim 14, wherein the process is used to make 0.10 μm IC devices.

18. The process of fabrication of claim 14, wherein the material is $SiO_2$.

19. The process of fabrication of claim 13, wherein the multi-layer includes $SiO_2$, $SiN_x$, and resist.

20. The method of claim 13, wherein the multi-layer includes $SiO_2$, $Si_3N_4$, and resist.

21. A process for device fabrication, comprising:

coating a wafer with a multi-layer;

defining shallow trench isolation and alignment patterns in the multi-layer;

etching trenches in the multi-layer and the wafer to a depth suitable for shallow trench isolation;

coating the wafer with a second layer;

etching alignment mark trenches in the second layer and the wafer to a depth greater than the trench depth, suitable for alignment mark detection;

depositing material to fill the trenches for shallow trench isolation and fill the alignment mark trenches for alignment mark detection; and performing chemical mechanical polishing, leaving shallow trench isolation features and $SiO_2$/Si alignment marks.

22. The process for device fabrication of claim 21, wherein the process is applicable to projection beam lithography, shaped beam lithography, or direct write electron beam lithography.

23. The process of fabrication of claim 22, wherein the process is applicable to SCALPEL.

24. The process of fabrication of claim 22, wherein the process is used to make 0.16 μm IC devices.

25. The process of fabrication of claim 22, wherein the process is used to make 0.10 μm IC devices.

26. The process of fabrication of claim 21, wherein the material is $SiO_2$.

27. The process of fabrication of claim 21, wherein the multi-layer includes $SiO_2$, $SiN_x$, and resist.

28. The method of claim 21, wherein the multi-layer includes $SiO_2$, $SiN_3N_4$, and resist.

* * * * *